United States Patent [19]

Kozlovsky et al.

[11] Patent Number: 5,111,468
[45] Date of Patent: May 5, 1992

[54] DIODE LASER FREQUENCY DOUBLING USING NONLINEAR CRYSTAL RESONATOR WITH ELECTRONIC RESONANCE LOCKING

[75] Inventors: William J. Kozlovsky, Mountain View; Wilfried Lenth, Capitola, both of Calif.

[73] Assignee: International Business Machines Corporation, Armonk, N.Y.

[21] Appl. No.: 597,964

[22] Filed: Oct. 15, 1990

[51] Int. Cl.$^5$ .............................. H01S 3/133
[52] U.S. Cl. ........................ 372/32; 372/20; 372/22; 372/75; 372/94; 359/328
[58] Field of Search ............. 372/21, 22, 20, 32, 372/29, 75, 94; 307/425, 477

[56] References Cited

U.S. PATENT DOCUMENTS

| | | | |
|---|---|---|---|
| 4,019,159 | 4/1977 | Hon et al. | 372/22 |
| 4,181,899 | 1/1980 | Liu | 372/32 |
| 4,578,793 | 3/1986 | Kane et al. | 372/94 |
| 4,583,228 | 4/1986 | Brown et al. | 372/32 |
| 4,809,291 | 2/1989 | Byer et al. | 372/22 |
| 4,884,276 | 11/1989 | Dixon et al. | 372/21 |
| 4,907,237 | 3/1990 | Dahmani et al. | 372/75 |
| 4,907,238 | 3/1990 | Chun et al. | 372/75 |
| 4,918,700 | 4/1990 | Gambini | 372/29 |

Primary Examiner—William L. Sikes
Assistant Examiner—Susan S. Morse
Attorney, Agent, or Firm—Bo-In Lin

[57] ABSTRACT

A semiconductor laser apparatus comprises a DC power supply coupled with an RF source which generates a low-amplitude RF current which is injected into a diode laser source. An optical beam shaping system processes the laser beam and directs it to a nonlinear resonator having a plurality of longitudinal resonator frequencies with a fundamental spatial mode. The nonlinear resonator uses a phase-matched, second harmonic generation (SHG) process to generate a second laser beam by frequency doubling the central carrier frequency of the diode laser source, and further reflects a portion of the incident laser beam to an electronic resonance locking system. The electronic resonance locking system has a photodetector to receive the reflected portion of the incident beam from the resonator and generates an RF signal arising from the difference in phase shifts or amplitude losses experienced by the RF sidebands. An RF mixer receives the RF signal from the photodetector and an input from the RF source to generate an error signal as a feedback signal which is supplied to the diode laser source for tuning the laser injection current.

17 Claims, 3 Drawing Sheets 5,111,468

DIODE LASER FREQUENCY DOUBLING USING NONLINEAR CRYSTAL RESONATOR WITH ELECTRONIC RESONANCE LOCKING

FIELD OF THE INVENTION

This invention relates to frequency doubling and electronic frequency locking in a laser system and, more particularly, to a laser system in the blue spectral region for use in an optical storage device.

DESCRIPTION OF THE PRIOR ART

Because of the short wavelength, blue laser sources are of interest for a number of applications such as optical data storage, laser printing, and biochemical analysis. Presently, semiconductor diode lasers are operating in the infrared region used for writing and reading of digital data in an optical data storage system. A laser beam emitted from the diode laser is optically processed and then directed to focus on a spot on the optical disk to write, erase, or read a binary bit. The size of the spot impinging on a data track is a function of the wavelength of the laser beam. The diameter of the spot is approximately one half of the ratio of the wavelength to the numerical aperture of the focusing lens. For a gallium-aluminum-arsenide (GaAlAs) laser, the wavelength is approximately 780 to 850 nm. With a lens having a numerical aperture of 0.5, the spot impinging on a disk is approximately 860 nm in diameter.

Nonlinear optical processes, such as frequency doubling, can be used to reduce the laser wavelength to half of its value, whereby the diameter of the focused spot is also reduced proportionally; thus, a quadruple data storage density may be achieved. Infrared diode lasers, such as GaAlAs lasers, when converted into blue light by use of the frequency doubling method, can potentially increase the optical data storage areal densities by a factor of four to several Gbit/square inch.

One technique to convert light to a higher frequency is known as second harmonic generation (SHG). A laser beam at a first lower frequency is passed through a nonlinear crystal, such as potassium niobate (KNbO$_3$), which produces the second harmonic laser beam, i.e., a beam at twice the frequency of the original laser frequency of the nonlinear crystal. This SHG technique is discussed in articles by M. K. Chun et al., Applied Physics Letters, Vol. 53, p. 1170, Sep. 26, 1988; and P. Gunter et al., Applied Physics Letters, Vol. 35, p. 461, Sep. 15, 1979. However, since the diode lasers' output power is low, techniques to improve the second harmonic conversion efficiency are required to produce useful and efficient laser devices.

One technique for increasing the efficiency of frequency doubling for low power lasers by using the nonlinear crystal in an optical cavity was originally proposed and demonstrated by Ashkin et al., IEEE Journal of Quantum Electronics, Vol. QE-2, p. 109, 1966. Frequency doubling of GaAlAs diode lasers using a build-up cavity containing a nonlinear crystal such as potassium niobate (KNbO$_3$) offers the potential for the design of simple, compact laser devices. For the build up to occur, the external cavity resonant frequency must match the diode laser frequency. Otherwise, fluctuations of the power coupled to the resonator can cause substantial fluctuations in the resulting blue laser output. In both Goldberg et al., Applied Physics Letters, Vol. 55, p. 218, 1989; and Baer et al., Conference on Lasers and Electro-Optics, Paper ThM5, 1989, this frequency matching was not maintained and, therefore, stable output could not result. Some means must therefore be used to control either the laser frequency or the resonator frequency to maintain the frequency matching so that a stable, useful laser output can result.

Some frequency control was obtained in Dixon et al., Optical Letters, Vol. 14, p. 731, 1989, using optical feedback from the cavity to lock the output frequency of the diode laser. This optical feedback technique, though, requires precise control of the amplitude of the optical feedback signal for stable operation, as well as requiring phase control and interferometric stability to ensure the proper phase for the feedback signal. An alternative locking technique is therefore desirable.

While the laser source is not a diode laser, a technique currently used to lock dye and argon lasers to external reference cavities is based on the Pound-Drever approach (see R. W. P. Drever et al., Applied Physics B, Vol. 31, p. 97, 1983), which produces a frequency modulation (FM) spectroscopy signal (see G. C. Bjorklund et al., Applied Physics B, Vol. 32, p. 145, 1983) of the cavity resonance for use as an error signal. For this technique, the laser source beam is sent through a phase modulator driven by a radio frequency (RF) source to produce two FM sidebands at the RF modulation frequency around the laser "carrier" frequency. In an effort to provide a strong locking signal, the FM sidebands around the carrier frequency are usually chosen outside of the cavity resonance linewidth and so are reflected from the cavity. The portion of the incident laser beam reflected from the cavity is detected with a photodiode. Each of the sidebands beats with the carrier reflected on the detector. On resonance, the two beat signals cancel. If the carrier frequency does not exactly match the resonance frequency, the imbalance in the relative phase or reflection amplitude experienced by the sidebands results in a signal at the RF modulation frequency. A double balanced mixer demodulates this reflected signal with the original RF source to produce an error signal for locking. Locking of dye or argon laser sources to the external cavity can then be accomplished by controlling the laser cavity length and therefore its output frequency with piezoelectric elements.

Subsequently, the Pound-Drever approach was used to lock the resonant frequency of a lithium niobate build-up resonator to the output from a diode-pumped solid state ring laser for frequency doubling to produce an output laser beam in the green spectral region (see W. J. Kozlovsky et al., IEEE Journal of Quantum Electonics, Vol. 24, p. 913, 1988). A high-voltage RF field was applied to the lithium niobate to produce the FM sidebands. The Pound-Drever technique was then used for error signal generation. The cavity resonance frequency was then locked to the laser output frequency by the application of a high-voltage DC field to the nonlinear resonator, thereby controlling the resonator frequency using the electro-optic effect. However, the use of an external phase modulator or high-voltage RF field on the nonlinear resonator is undesirable for many applications. The high-voltage RF sources are often unsuitable for compact devices. The large voltage variations in the nonlinear resonators may also adversely affect the performance and lifecycle of the resonators.

An alternative approach is possible when using a diode laser source since FM modulation may be achieved by direct modulation of the diode laser current (see W. Lenth, IEEE Journal of Quantum Electonics, Vol. QE-20, p. 1045, 1984). In addition, the diode laser frequency can be tuned by changing the injection current (at a typical rate of ~3 GHz/mA) or diode laser temperature (at a typical rate of 30 GHz/°C.) so that the diode laser frequency can be locked to a fixed external cavity resonance frequency. In Sollberger et al., Journal of Lightwave Technology, Vol. LT-5, p. 485, 1987, the diode laser was locked to a standard Fabry-Perot resonator for frequency stabilization of the diode laser output. However, the cavity did not contain a nonlinear crystal and no second harmonic laser beam was generated. Thus, the frequency locking was to a standard referenced optical resonator, not one capable of efficient frequency doubling.

What is lacking in the sum of the prior art is a frequency doubling device which uses a diode laser source with an output beam containing FM sidebands, a nonlinear crystal resonator for efficient second harmonic generation, and an electronic frequency locking system which uses an error signal from the frequency modulated diode laser light to control the diode laser output frequency so it is in resonance with the nonlinear crystal resonator. Due to these limitations and difficulties in the prior art, a stable and high-intensity output from a diode laser based frequency doubling device suitable for applications requiring a compact laser source has not yet been achieved.

SUMMARY OF THE INVENTION

An object of the present invention is to generate coherent radiation in the blue spectral region from a diode laser by improving the conversion efficiency of the second harmonic generation process with a nonlinear resonator.

Another object of the invention is to provide a stable and efficient frequency locking between the diode laser and the nonlinear resonator by the use of an electronic resonance locking system so that stable generation of a blue output laser is obtained.

In the present invention, a semiconductor laser apparatus comprises a DC power supply coupled with an RF source which generates a low amplitude RF current. This combined current is injected into a diode laser source. The diode laser source emits a laser beam with a central carrier frequency having low-amplitude frequency sidebands generated by the RF current. An optical beam shaping system processes the laser beam and directs it to the nonlinear resonator. The nonlinear resonator has a plurality of longitudinal resonator frequencies with a fundamental spatial mode. The optically-shaped laser beam substantially matches the fundamental spatial profile, and meanwhile the central carrier frequency of the diode laser substantially matches one of the longitudinal resonator frequencies. The nonlinear resonator uses a phase-matched, second harmonic generation (SHG) process to generate a second laser beam by frequency doubling the central carrier frequency of the diode laser source. The resonator further reflects a portion of the incident optically-shaped laser beam to an electronic resonance locking system. The electronic resonance locking system has a photodetector to receive the reflected portion of the optically-shaped beam from the resonator and generates an RF signal arising from the difference in phase shifts or amplitude losses experienced by the RF sidebands caused by any frequency mismatch between the central laser frequency and the substantially matched longitudinal resonator frequency. The electronic frequency locking system further includes an RF mixer which receives the RF signal from the photodetector and an input from the RF source to generate an error signal as a feedback signal which is supplied to the diode laser source for tuning the laser injection current or the diode temperature, whereby the diode laser central carrier frequency is controlled by the tuning of the injection current or diode temperature to automatically track the substantially matched longitudinal resonator frequency.

In accordance with the present invention, the injection current of the diode laser is modulated at an RF frequency to produce FM sidebands for generation of the error signal which is used to lock the laser frequency by current or temperature tuning to a nonlinear resonant frequency in order to produce a stable output beam at the second harmonic frequency.

In a particular embodiment of this invention where 105 mW of near infrared power from a GaAlAs laser is incident on a nonlinear resonator fabricated from the material potassium niobate, 41 mW of 428 nm radiation is produced. The conversion efficiency from electrical input power into the diode laser to blue output is approximately 10 percent. With the servo loop closed, the GaAlAs laser frequency remained locked to the nonlinear cavity resonance resulting in stable 428 nm output. The amplitude noise is low; the relative intensity noise (RIN) is measured to be −120 dB at 5 MHz. Therefore, it is demonstrated that this invention teaches an efficient and stable frequency doubling laser system which overcomes the limitations experienced in the prior art by providing a high SHG conversion efficiency to produce a high-intensity, frequency-doubled laser beam with high stability, low output noise, and high beam quality.

DESCRIPTION OF THE PREFERRED EMBODIMENT

Figure 1:
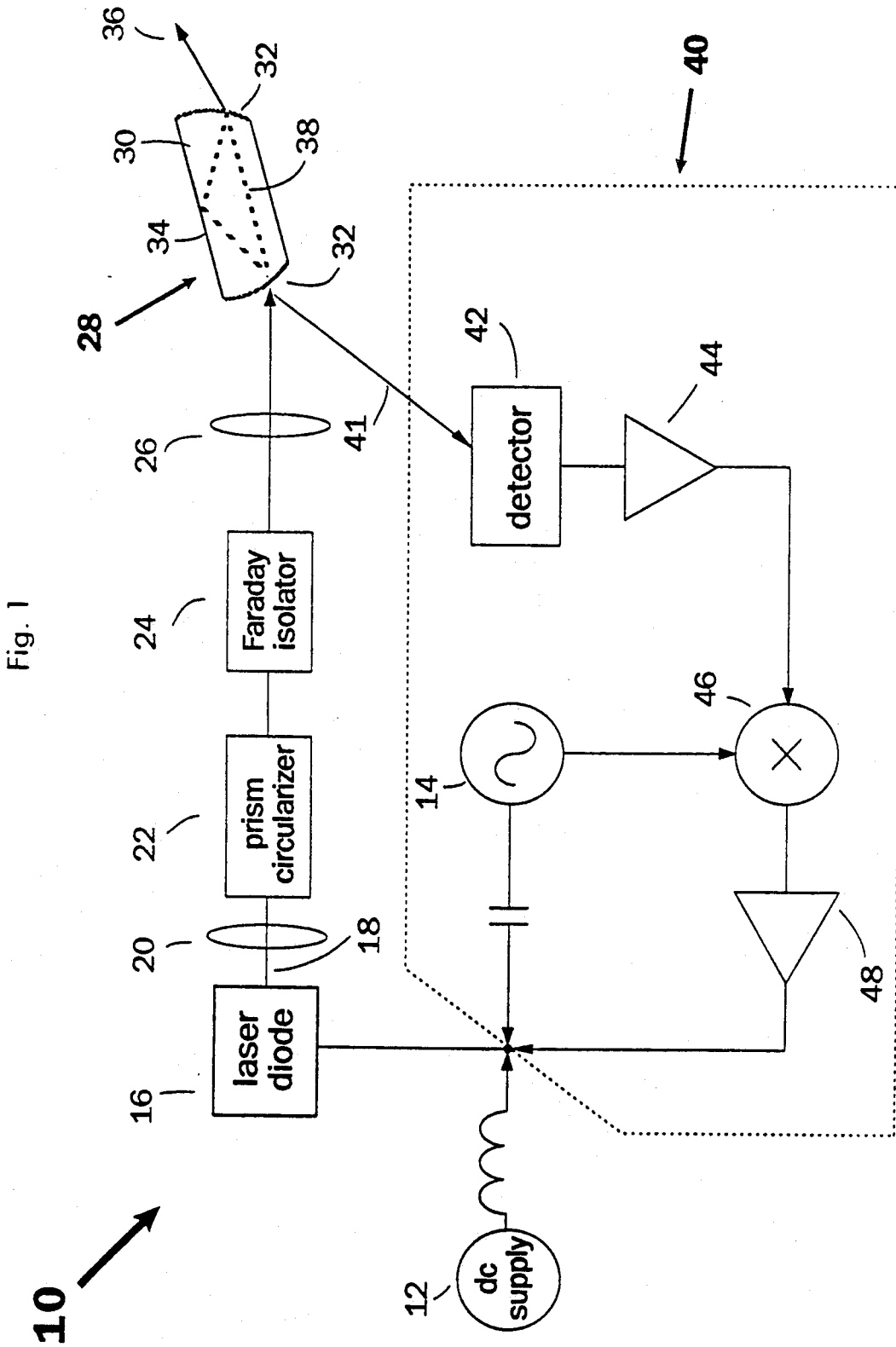
FIG. 1 shows a schematic diagram of the laser system taught by the present invention.
Figure 2:
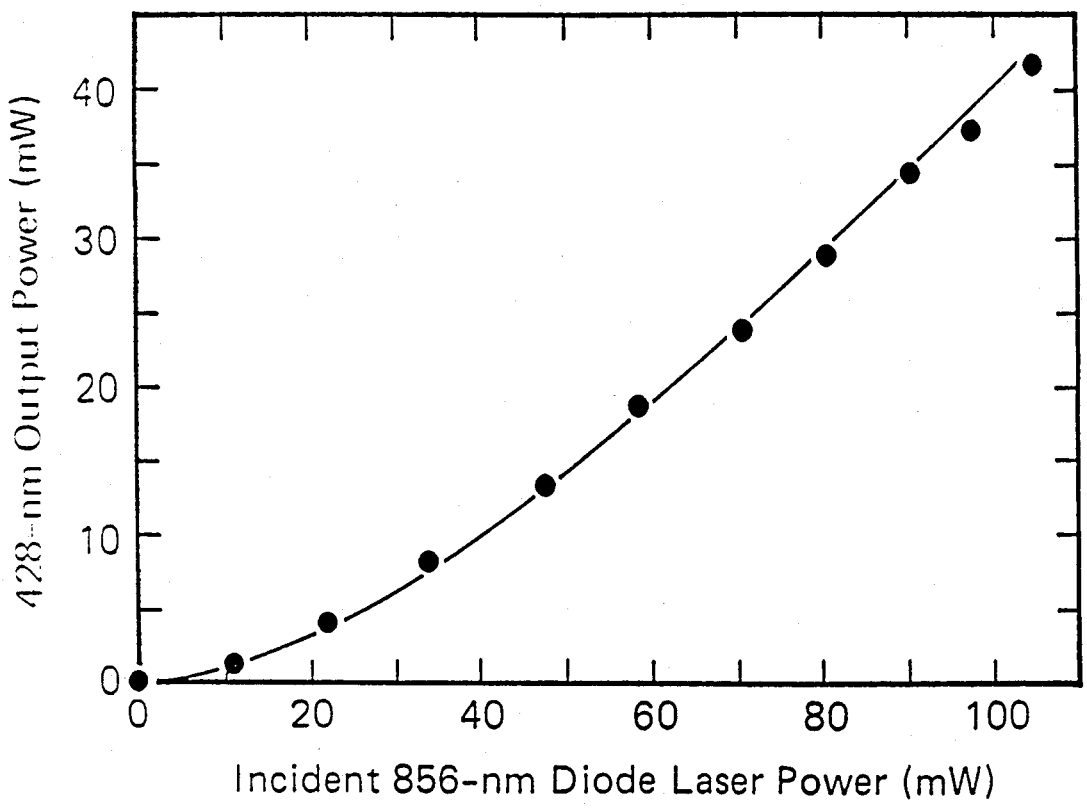
FIG. 2 shows the observed output power from the preferred embodiment of the present invention as a function of the incident power.
Figure 3:
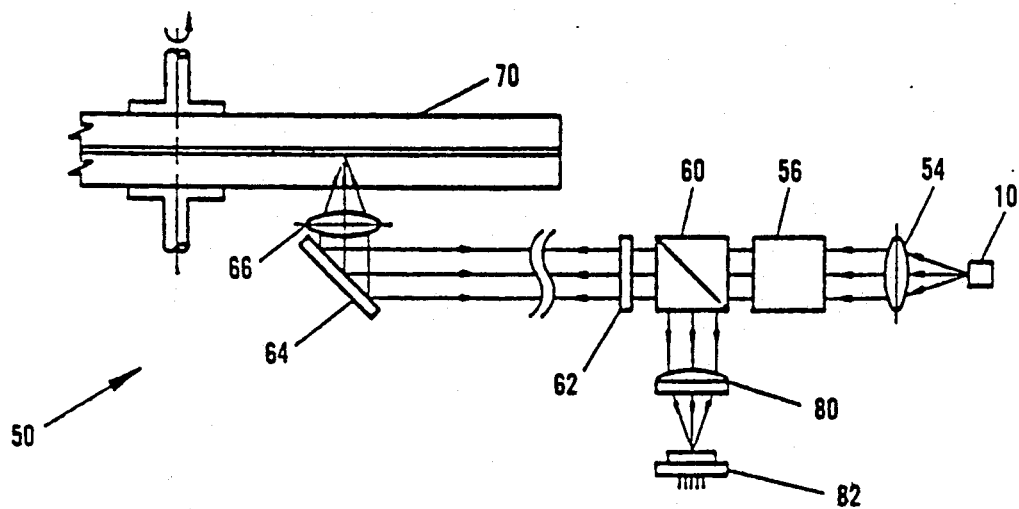
FIG. 3 shows a schematic diagram of a data storage system implementing the laser output beam of the present invention.

While this invention may be embodied in many forms, they are schematically shown in FIGS. 1-3 with the understanding that the present disclosure is not intended to limit the invention to the embodiments illustrated.

With reference to FIG. 1, a laser system 10 is shown. Laser system 10 comprises a DC power supply 12 and a coupled RF power source 14 which generates a low-amplitude RF current. The coupled DC power supply 12 and the low-amplitude RF source 14 provide an injection current to a diode laser source 16. Laser source 16 may be a GaAlAs laser diode which generates a laser beam with a wavelength of approximately 860 nm with two low-amplitude frequency sidebands. The laser beam is propagated along an optical axis 18.

In this specific embodiment of the present invention, the diode laser used is a ridge waveguide, single quantum well, graded index, double heterostructure, GaAlAs diode laser grown by molecular beam epitaxy. The diode laser operates in a single axial mode which can be tuned to 856 nm by adjusting the temperature to 40° C. With an injection current of 195 mA, the single-mode output power is 160 mW.

A lens 20, a circularizer 22, and a Faraday isolator 24 are all disposed and aligned to receive and optically process the diode laser output. The diode laser output is collimated by lens 20 and circularized by circularizer 22. Faraday isolator 24 is used to prevent back-reflected light and scattered light from reaching diode laser source 16. The laser beam is further processed by a lens 26 to couple into the fundamental mode of a nonlinear resonator 28.

In a specific embodiment, the diode laser output is collimated with an 8.6 mm focal length lens and circularized with an anamorphic prism pair. The diode laser radiation is coupled into the fundamental mode of the nonlinear resonator 28 using a lens with a focal length of 250 mm for spatial mode matching. The overall transmission of the optics is 66 percent so that a maximum 856 nm power of 105 mW is incident on the nonlinear crystal resonator.

Nonlinear resonator 28 is fabricated from a nonlinear crystal material 30, such as potassium niobate. The specific crystal material 30 is shaped as an elongated cylinder having a length in the range of about 2-10 mm. Crystal material 30 is aligned with an orientation to receive the optically-shaped incident beam into the off-axis ring path of the nonlinear resonator 28. Crystal material 30 is polished to have curved mirrors 32 at both ends and flat total internal reflection surfaces 34 parallel to the mirror axis. Dielectic mirror coatings of high reflectivity at the fundamental wavelength of diode laser 16 are deposited onto curved mirrors 32.

The mirror coating reflectivities are designed for optimum coupling of the infrared diode laser radiation to the cavity, taking into account both the internal losses of the nonlinear crystal, i.e., roundtrip loss of approximately 2 percent in a specific embodiment of a 7 mm crystal length, and the anticipated losses due to SHG. Crystal material 30 is oriented to permit phase-matched, second harmonic generation (SHG) along axis 38 so that single-ended output laser beam 36 with double frequency of diode laser 16 is generated. Beam 36 is a blue output laser when laser diode source 16 is an 860 nm GaAlAs diode.

For simplicity, nonlinear resonator 28 is shown as a monolithic ring cavity, although the use of the well-known standing wave cavity or a discrete mirror design is also possible. A typical linewidth for such cavities would be ~200 MHz. The diode laser is modulated by an RF source at typically several hundred MHz, though higher or lower modulation frequencies are certainly possible. For the stability of the noncritically phase-matched frequency doubling, resonator 28 may be controlled by a thermoeclectric cooler element for maintaining a stabilized temperature. In order to achieve phase-matched frequency doubling of the 856 nm laser output, the $KNbO_3$ crystal is maintained at 15° C.

Resonator 28 reflects a portion of the optically-shaped beam to an electronic resonance locking system 40 shown enclosed by a broken line. The reflected portion of the optically-shaped beam 41 is first directed to a detector 42. Detector 42 generates an RF signal arising from the difference in phase shifts or amplitudes between the RF frequency sidebands caused by any mismatch between the central carrier frequency of diode laser 16 and the resonant frequency of resonator 28. The RF signal is amplified by a first amplifier 44, and then coupled to the input of RF mixer 46. RF mixer 46 receives the amplified RF signal from the detector 42 and mixes it with a signal from low-amplitude RF source 14 for demodulation and generation of an error signal. The mixer output, which is an error signal indicative of the matching of the laser and resonator frequencies, is amplified by a second amplifier 48. The amplified error signal is used as a feedback signal for tuning the laser injection current or the diode temperature such that the central carrier frequency of the diode laser is automatically adjusted to track any changes in the longitudinal resonator frequency. In the preferred embodiment, the error signal is coupled to the injection current from DC power supply 12.

While blue-light generation using potassium niobate and GaAlAs diode lasers has been used in a specific embodiment of the present invention, generation of other wavelengths such as green, violet, and ultraviolet are also possible using other components. Other nonlinear crystals, such as lithium niobate, lithium in diffused lithium niobate, lithium potassium niobate, lithium iodate, KTP, KTA, barium borate, LBO, and periodically poled KTP and lithium niobate will permit phase-matched SHG using a number of different fundamental wavelengths. These fundamental wavelengths can be generated from various diode laser systems such as GaAlAs diode lasers, InGaAs strained-layer lasers, InGaAsP lasers, and AlGaInP lasers.

FIG. 2 as a specific embodiment shows the frequency doubled blue laser output with a wavelength of 428 nm emerging from the $KNbO_3$ ring cavity as a function of the incident 856 nm diode laser power from laser source 16. At 105 mW of infrared power incident onto resonator 28, 41 mW of 428 nm output power are produced for an optical conversion efficiency of 39 percent. Approximately 80 percent of the incident diode laser power is actually coupled into resonator 28. The conversion from electrical power into the diode laser to blue output power is approximately 10 percent. With the servo loop closed, the GaAlAs laser frequency remains locked to the nonlinear cavity resonance, resulting in stable 428 nm output. The amplitude noise is low; the relative intensity noise (RIN) is measured to be $-120$ dB at 5 MHz. The blue output beam has a slightly elliptical (1.1:1) Gaussian intensity distribution with low astigmatism, as expected for the resonator design. Using a lens with a numerical aperture of 0.65 N.A., the 428 nm frequency doubled blue laser beam 36 is focused to an essentially diffraction limited spot of 0.4 $\mu$m FWHM.

FIG. 3 shows a phase change optical disk data storage system 50 which uses a laser system of the present invention, i.e., laser system 10 as shown in FIG. 1. The laser beam from system 10 is collimated by a lens 54 and passes through an optical circularizing optical element 56, which may be a prism. Element 56 emits a beam with a circular cross-sectional pattern. The laser beam then passes through a polarizing beam splitter 60 and a quarterwave plate 62. The laser beam is reflected off from a mirror 64 and focused by a lens 66 onto an optical recording medium 70.

The beam reflected from medium 70 returns through lens 66. It is then reflected off from mirror 64 and passes through plate 62 to beam splitter 60. The reflected beam is then diverted by beam splitter 60 to astigmatic lens 80. Lens 80 focuses the reflected light onto an optical detector 82. The recorded spots of the media 70 have different reflectivities, and these differences are detected by optical detector 82 as one bit representing a binary state of either one or zero. Detector 82 also provides tracking and focus signals for disk tracking and access control.

Figure 4:
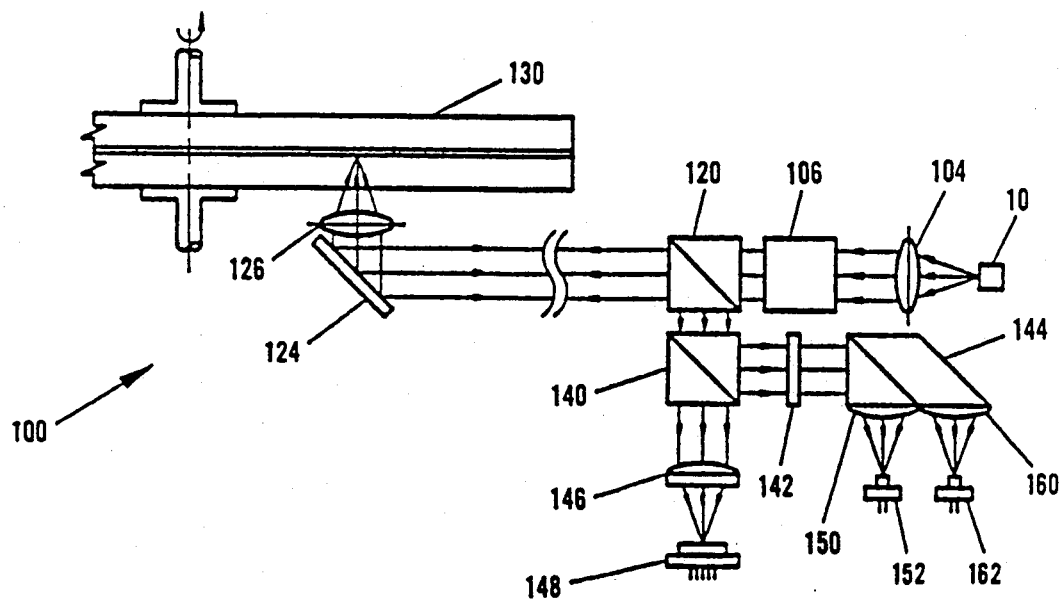
FIG. 4 shows another schematic diagram of a data storage system implementing the laser output beam of the present invention.

FIG. 4 shows a magneto-optical disk storage system 100 which uses a laser system of the present invention, i.e., system 10 as shown in FIG. 1. The laser beam from system 10 is collimated by a lens 104 and passes through an optical circularizing element 106. Element 106 then circularizes and emits a beam with a circular cross-section pattern. Element 106 may be a prism.

The laser beam then passes through a leaky polarizing beam splitter 120. Beam splitter 120 has reflectivities of Rp>0 and Rs approximately equal to one (p and s represent the orthogonal polarization components of the light; the beam of laser system 10 is essentially polarized parallel to the p direction). The beam is then reflected off from a mirror 124 to a lens 126 and is focused onto an optical recording medium 130. Medium 130 may be a magneto-optical type of recording medium.

The laser reflected from medium 130 returns through lens 136. It is then reflected off from mirror 124 and enters into beam splitter 120. Beam splitter 120 diverts a portion of the reflected beam to an amplitude beam splitter 140. The reflected data beam is diverted to a halfwave plate 142 and to a beam splitter 144. The reflected beam of other amplitudes passes straight through beam splitter 148 to produce tracking and focus signals.

Medium 130 has recorded spots having either an up or down magnetic domain. The plane of polarization of the beam reflected off these spots is rotated one way or the other depending upon the direction of the magnetic domain. Beam splitter 134 separates the reflected beam depending upon which way the plane of polarization has been rotated. Separated beams go to a lens 150 and an optical detector 152 or to a lens 160 and an optical detector 162. The difference in the output signals of detectors 152 and 162 is the bits of data representing a binary state of one or zero.

The present invention demonstrates that nonlinear frequency up-conversion techniques can permit the design of compact, efficient, and useful blue laser devices based on the presently available GaAlAs diode lasers. These blue sources offer attractive output powers and efficiencies as required for optical storage applications.

An electronic servo technique which makes use of the convenient frequency modulation and current tuning capabilities of semiconductor lasers is used to lock the output frequency of a GaAlAs diode laser to a monolithic ring resonator of $KNbO_3$. This results in stable and efficient second harmonic generation of blue 428 nm radiation with an output power of 41 mW.

The laser system of the present invention has other applications besides data storage. The present invention could be used in medical equipment, chemical testers and monitors, color displays, remote sensors, laser printers, and many other applications which cannot be exhaustively listed here. While the preferred embodiments of the present invention have been illustrated in detail, it should be apparent that modifications and adaptations to those embodiments may occur to one skill in the art without departing from the scope of the present invention as set forth in the following claims.

We claim:

1. A semiconductor laser apparatus comprising:

a DC power supply coupled with an RF source generating a low-amplitude RF current;

a diode laser source receiving an injection current from the DC power supply and the coupled RF current source emitting a laser beam with a central carrier frequency having low-amplitude frequency sidebands generated by the RF current;

an optical beam shaping system for processing and directing the laser beam emitted from the diode laser source;

a nonlinear resonator having a plurality of longitudinal resonator frequencies with a fundamental spatial mode receiving the optically-shaped laser beam, said optically-shaped beam substantially matching the fundamental spatial profile and the central carrier frequency substantially matching one of the longitudinal resonator frequencies;

said nonlinear resonator using a phase-matched, second harmonic generation (SHG) process for generating a second laser beam by frequency doubling the central carrier frequency of the diode laser source, and further reflecting a portion of the incident optically-shaped laser beam to an electronic resonance locking system;

said electronic resonance locking system having a photodetector receiving the reflected portion of the optically-shaped beam from the resonator and generating an RF signal arising from the difference in phase shifts or amplitudes between said RF sidebands caused by any frequency mismatch between the central laser frequency and said substantially matched longitudinal resonator frequency; and said electronic frequency locking system further including an RF mixer electrically coupled to the diode laser source receiving the RF signal from the photodetector and an input from the RF source for generating an error signal as a feedback signal which is supplied to the diode laser source for tuning the laser injection current or the diode temperature, whereby the diode laser central carrier frequency is controlled by the tuning of the injection current or diode temperature to track the substantially matched longitudinal resonator frequency.

2. A semiconductor laser apparatus comprising:

a DC power supply coupled to an RF source generating a low-amplitude RF current;

a gallium-aluminum-arsenide diode laser source receiving an injection current from the DC power supply and the coupled RF current source emitting a laser beam with a central carrier frequency corresponding to a wavelength of approximately 860 nm having low-amplitude frequency sidebands generated by the RF current;

an optical beam shaping system for processing and directing the laser beam emitted from the diode laser source;

a potassium niobate nonlinear resonator having a plurality of longitudinal resonator frequencies and an associated fundamental spatial mode, said optically-shaped beam matching substantially to the fundamental spatial mode and said central carrier frequency matching substantially one of the longitudinal resonator frequencies;

said nonlinear resonator receiving the optically-shaped laser beam using a phase-matched, second harmonic generation (SHG) process for generating a second laser beam in the blue spectral region by frequency doubling said central carrier frequency, and further reflecting a portion of the incident optically-shaped laser beam to an electronic resonance locking system;

said electronic resonance locking system having a photodetector receiving the reflected portion of the optically-shaped beam from the resonator and generating an RF signal arising from the difference in phase shifts or amplitudes between said RF sidebands caused by any frequency mismatch between the central carrier frequency and the substantially matched longitudinal resonator frequency; and said electronic frequency locking system further including an RF mixer electrically coupled to the diode laser source receiving the RF signal from the photodetector and an input from the RF source for generating an error signal as a feedback signal which is supplied to the diode laser source for tuning the laser injection current or diode temperature, whereby the diode laser central carrier frequency is controlled by the tuning of the injection current or diode temperature to track the substantially matched longitudinal resonator frequency of the potassium niobate nonlinear resonator.

3. A semiconductor laser apparatus of claim 2, wherein said nonlinear resonator is a potassium niobate nonlinear ring resonator.

4. A semiconductor laser apparatus of claim 3, wherein said RF mixer is a double balanced RF mixer.

5. A semiconductor laser apparatus of claim 4, wherein said optical beam shaping system further comprises a lens and a prism or lens for collimating and circularizing the beam and a Faraday isolator for preventing back reflection and scattering of the laser beam.

6. A semiconductor laser apparatus of claim 5, wherein said optical beam shaping system further comprises a lens to receive the optically-shaped beam and to focus the beam for coupling into the resonator.

7. A semiconductor laser apparatus of claim 6, wherein said electronic resonance locking system further comprising an amplifier receiving output signals from the photodetector and amplifying the photodetector signals before transmitting the signals to the RF mixer.

8. A semiconductor laser apparatus of claim 7, wherein said electronic resonance locking system further comprises a second amplifier receiving output error signals from the double balanced RF mixer and amplifying the error signals before transmitting the signals as feedback to the diode laser source.

9. A process to generate a laser beam comprising the steps of:

injecting a DC current coupled with a low-amplitude RF current to a laser diode source for generating a laser beam having a central carrier frequency and low-amplitude frequency sidebands;

optically shaping and directing the laser beam into a nonlinear resonator, said resonator having a plurality of longitudinal resonant frequencies with a fundamental spatial mode, said optically-shaped beam substantially matching the fundamental spatial mode and said central carrier frequency matching substantially one of the longitudinal resonator frequencies;

transmitting the laser beam through the resonator using a phase-matched, second harmonic generation (SHG) process generating a second laser beam by frequency doubling the central carrier frequency;

reflecting a portion of the optically-shaped incident beam from the resonator to a photodetector;

generating an RF signal using the difference in phase shifts or amplitudes of the sidebands caused by any frequency mismatch between the central carrier frequency and the substantially matched resonator frequency;

generating an error signal corresponding to said RF signal coupling with an input from the low-amplitude RF current; and tuning the laser injection current by coupling to the DC current and the low-amplitude RF current or diode temperature by using the error signal as feedback, whereby the central carrier frequency of the diode laser source is controlled by said tuning of the injection current or diode temperature to track the substantially matched longitudinal resonator frequency.

10. A process to generate a laser beam in the blue spectral region comprising the steps of:

injecting a DC current coupled with a low-amplitude RF current to a GaAlAs laser diode source for generating a laser beam having a central carrier frequency with a corresponding wavelength of approximately 860 nm and low-amplitude frequency sidebands;

optically shaping and directing the laser beam into a nonlinear resonator, said resonator having a plurality of longitudinal resonant frequencies with a fundamental spatial mode, said optically-shaped beam substantially matching the fundamental spatial mode and said central carrier frequency matching substantially one of the longitudinal resonator frequencies;

transmitting the laser beam through the ring resonator using a phase-matched, second harmonic generation (SHG) process for generating a second laser beam in the blue spectral region by doubling the central carrier frequency of the diode laser;

reflecting a portion of the optically-shaped incident beam from the resonator to a photodetector;

generating an RF signal by using the difference in phase shifts or amplitudes between the low-amplitude sidebands caused by any frequency mismatch between the central carrier frequency and the substantially matched resonator frequency;

generating an error signal corresponding to said RF signal coupling with an input from the low-amplitude RF current; and tuning the laser injection current by coupling to the DC current and the low-amplitude RF current or diode temperature by using the error signal as feedback, whereby the central carrier frequency of the diode laser is controlled by said tuning of the injection current or diode temperature to track the substantially matched longitudinal resonator frequency of the nonlinear resonator.

11. A process to generate a laser beam in the blue spectral region of claim 10, wherein the step of optically shaping the beam emitted from the diode laser source further comprises the step of collimating and circularizing the beam before the diode laser beam is transmitted into the nonlinear ring resonator.

12. A process to generate a laser beam in the blue spectral region of claim 11, wherein the step of optically shaping the beam emitted from the diode laser source further comprises the step of preventing the back reflection of the diode laser beam, thus eliminating optical feedback resulting from said SHG process.

13. A process to generate a laser beam in the blue spectral region of claim 12, wherein the step of optically shaping the beam emitted from the diode laser source further comprises the step of focusing the optically-shaped beam before said beam is transmitted into the nonlinear ring resonator.

14. A process to generate a laser beam in the blue spectral region of claim 13, wherein the step of generating an RF signal by using the difference of the phase shifts or amplitudes between the sidebands further comprises the step of amplifying the RF signal before said signal is used in generating the error signal.

15. A process to generate a laser beam in the blue spectral region of claim 14, wherein the step of generating the error signal further comprises the step of amplifying the error signal before the amplified error signal is used as feedback for tuning the injection currents or diode temperature.

16. A laser data storage system having a laser source, an optical recording medium, an optical transmission means for directing a laser beam emitted from the laser source to the optical recording medium, and an optical reception means for receiving a reflected laser beam from the optical recording medium and proving a data signal responsive thereto, wherein said laser source further comprising:
   a DC power supply coupled with an RF source generating a low-amplitude RF current;
   a diode laser source receiving an injection current from the DC power supply and the coupled RF current source emitting a laser beam with a central carrier frequency having low-amplitude frequency sidebands generated by the RF current;
   an optical beam shaping system for processing and directing the laser beam emitted from the diode laser source;
   a nonlinear resonator having a plurality of longitudinal resonator frequencies with a fundamental mode receiving the optically-shaped laser beam, said optically-shaped beam substantially matching the fundamental spatial profile and the central carrier frequency substantially matching one of the longitudinal resonator frequencies;
   said nonlinear resonator using a phase-matched, second harmonic generation (SHG) process for generating a second laser beam by frequency doubling the central carrier frequency of the diode laser source and further reflecting a portion of the incident optically-shaped laser beam to an electronic resonance locking system;
   said electronic resonance locking system having a photodetector receiving the reflected portion of the optically-shaped beam from the resonator and generating an RF signal arising from the difference in phase shifts or amplitudes between said RF sidebands caused by any frequency mismatch between the central laser frequency and said substantially matched longitudinal resonator frequency; and
   said electronic frequency locking system further including an RF mixer electrically coupled to the diode laser source receiving the RF signal from the photodetector and an input from the RF source for generating an error signal as a feedback signal which is supplied to the diode laser source for tuning the laser injection current or the diode temperature,
   whereby the diode laser central carrier frequency is controlled by said tuning of the injection current or diode temperature to track the substantially matched longitudinal resonator frequency.

17. A magneto-optical disk storage system in which data is stored and read from a plurality of data tracks disposed on a disk, said storage system having a magnetic field source for generating a magnetic field for data recording, erasing, and reading, said storage system further including a laser source generating at least a laser beam and an optical system to focus the laser beam onto the disk tracks for the recording, erasing, or reading processes, said storage system further including a control system controlling the track access, the laser intensity, and focuses, said laser source comprising:
   a DC power supply coupled with an RF source generating a low-amplitude RF current;
   a diode laser source receiving an injection current from the DC power supply and the coupled RF current source emitting a laser beam with a central carrier frequency having low-amplitude frequency sidebands generated by the RF current;
   an optical beam shaping system for processing and directing the laser beam emitted from the diode laser source;
   a nonlinear resonator having a plurality of longitudinal resonator frequencies with a fundamental mode receiving the optically-shaped laser beam, said optically-shaped beam substantially matching the fundamental spatial profile and the central carrier frequency substantially matching one of the longitudinal resonator frequencies;
   said nonlinear resonator using a phase-matched, second harmonic generation (SHG) process for generating a second laser beam by frequency doubling the central carrier frequency of the diode laser source and further reflecting a portion of the incident optically-shaped laser beam to an electronic resonance locking system;
   said electronic resonance locking system having a photodetector receiving the reflected portion of the optically-shaped beam from the resonator and generating an RF signal arising from the difference in phase shifts or amplitudes between said RF sidebands caused by any frequency mismatch between the central laser frequency and said substantially matched longitudinal resonator frequency; and
   said electronic frequency locking system further including an RF mixer electrically coupled to the diode laser source receiving the RF signal from the photodetector and an input from the RF source for generating an error signal as a feedback signal which is supplied to the diode laser source for tuning the laser injection current or the diode temperature,
   whereby the diode laser central carrier frequency is controlled by said tuning of the injection current or diode temperature to track the substantially matched longitudinal resonator frequency.

* * * * *

UNITED STATES PATENT AND TRADEMARK OFFICE
CERTIFICATE OF CORRECTION

PATENT NO. : 5,111,468

DATED : 5/5/92

INVENTOR(S) : Kozlovsky et al.

It is certified that error appears in the above-identified patent and that said Letters Patent is hereby corrected as shown below:

At col. 11, line 30, "proving" should read --providing--.

Signed and Sealed this

Twenty-first Day of September, 1993

Attest:

BRUCE LEHMAN

Attesting Officer

Commissioner of Patents and Trademarks